(12) United States Patent
Harris

(10) Patent No.: US 10,731,252 B2
(45) Date of Patent: Aug. 4, 2020

(54) APPARATUS AND METHOD FOR COATING SPECIMENS

(71) Applicant: Rolls-Royce High Temperature Composites Inc., Cypress, CA (US)

(72) Inventor: Stephen Harris, Long Beach, CA (US)

(73) Assignee: ROLLS-ROYCE HIGH TEMPERATURE COMPOSITES, Cypress, CA (US)

( * ) Notice: Subject to any disclaimer, the term of this patent is extended or adjusted under 35 U.S.C. 154(b) by 21 days.

(21) Appl. No.: 15/989,697

(22) Filed: May 25, 2018

(65) Prior Publication Data

US 2019/0360097 A1 Nov. 28, 2019

(51) Int. Cl.
| | | |
|---|---|---|
| *C23C 16/455* | (2006.01) | |
| *C04B 41/85* | (2006.01) | |
| *C04B 41/87* | (2006.01) | |
| *C04B 41/45* | (2006.01) | |
| *C23C 16/32* | (2006.01) | |
| *C23C 16/34* | (2006.01) | |
| *C23C 16/26* | (2006.01) | |

(52) U.S. Cl.
CPC ...... *C23C 16/45559* (2013.01); *C04B 41/455* (2013.01); *C04B 41/457* (2013.01); *C04B 41/4531* (2013.01); *C04B 41/85* (2013.01); *C04B 41/87* (2013.01); *C23C 16/26* (2013.01); *C23C 16/325* (2013.01); *C23C 16/342* (2013.01); *C04B 2235/5244* (2013.01)

(58) Field of Classification Search
CPC . C23C 16/45559; C23C 16/26; C23C 16/342; C23C 16/325; C04B 41/457; C04B 41/4531; C04B 41/87; C04B 41/85; C04B 41/455; C04B 2235/5244
USPC .......................................... 427/248.1–255.7
See application file for complete search history.

(56) References Cited

U.S. PATENT DOCUMENTS

| | | | |
|---|---|---|---|
| 5,202,158 A | 4/1993 | Sakagami et al. | |
| 6,572,371 B1* | 6/2003 | Sion ...................... | C23C 16/045 118/724 |
| 7,691,440 B2* | 4/2010 | Bernard .................. | C04B 35/83 118/719 |
| 2008/0152803 A1* | 6/2008 | Lamouroux .......... | C23C 16/045 427/248.1 |
| 2011/0064891 A1* | 3/2011 | Golecki .................. | C04B 35/83 427/590 |
| 2015/0150682 A1 | 6/2015 | Vargas et al. | |
| 2016/0229758 A1 | 8/2016 | Kmetz et al. | |

* cited by examiner

*Primary Examiner* — Michael P Wieczorek
*Assistant Examiner* — Michael G Miller
(74) *Attorney, Agent, or Firm* — Brinks Gilson & Lione

(57) ABSTRACT

An apparatus for coating specimens includes a reaction chamber and a plurality of reaction modules in the reaction chamber for containing specimens to be coated, where each reaction module includes a module inlet and a module outlet. A plurality of conduits are configured to be in fluid communication with at least one gas source external to the reaction chamber, and each of the conduits terminates in one of the reaction modules for delivery of gaseous reagents to the specimens to be coated. The module outlets are in fluid communication with the reaction chamber for expulsion of gaseous reaction products from the reaction modules.

16 Claims, 2 Drawing Sheets

APPARATUS AND METHOD FOR COATING SPECIMENS

TECHNICAL FIELD

The present disclosure is related generally to an apparatus and method for coating specimens.

BACKGROUND

Ceramic matrix composites have been identified as candidate materials for components in the hot-section of jet engines due to their high temperature capability, low weight, and low coefficient of thermal expansion. In some instances these components are manufactured by laying up stacked 2D cloth or using 3D laminates to form a fiber preform, depositing a fiber-matrix interphase coating and rigidizing the fiber preform through chemical vapor infiltration (CVI), infiltrating the rigidized preform with a ceramic slurry to form an impregnated preform, and melt infiltrating the impregnated preform with molten silicon to render the composite nearly fully dense.

When performing CVI in a conventional "batch style" reactor 100, such as that shown in FIG. 1, gradients in deposition rate may occur throughout the reactor 100. This is particularly true when comparing deposition rates between levels; reaction product gases produced during deposition on the upstream levels can reverse bias the deposition reactions on the downstream levels, thereby reducing the deposition rate. An improved CVI method that reduces or eliminates downstream contamination from reaction product gases and improves the uniformity of the CVI process would be advantageous.

BRIEF SUMMARY

An apparatus for coating specimens includes a reaction chamber and a plurality of reaction modules in the reaction chamber for containing specimens to be coated, where each reaction module includes a module inlet and a module outlet. A plurality of conduits are configured to be in fluid communication with at least one gas source external to the reaction chamber, and each of the conduits terminates in one of the reaction modules for delivery of gaseous reagents to the specimens to be coated. The module outlets are in fluid communication with the reaction chamber for expulsion of gaseous reaction products from the reaction modules.

A method of coating specimens includes heating a reaction chamber containing a plurality of reaction modules and a plurality of specimens to be coated, where each of the reaction modules includes a module inlet and a module outlet and contains at least one of the specimens. Gaseous reagents are flowed through the module inlets and into the reaction modules where they chemically react to form coatings on the specimens. A pressure in each of the reaction modules is higher than a pressure in the reaction chamber, and thus gaseous reaction products are expelled from the reaction modules through the module outlets and may be removed from the reaction chamber through one or more outlet ports during operation.

DETAILED DESCRIPTION

A new apparatus for chemical vapor infiltration (CVI) of porous specimens, such as ceramic fiber preforms, has been developed. The apparatus may also be used to coat specimens using chemical vapor deposition (CVD). The apparatus is designed to reduce or eliminate downstream contamination from reaction product gases, thereby allowing coatings to be uniformly deposited on a number of specimens throughout the apparatus. A coating method that may be carried out in the apparatus is also described below. Components referred to as being "in fluid communication with" each other in the description that follows are directly or indirectly connected or otherwise related in such a way that fluid (e.g., a gas) can flow between the components in one or both directions.

Figure 2:
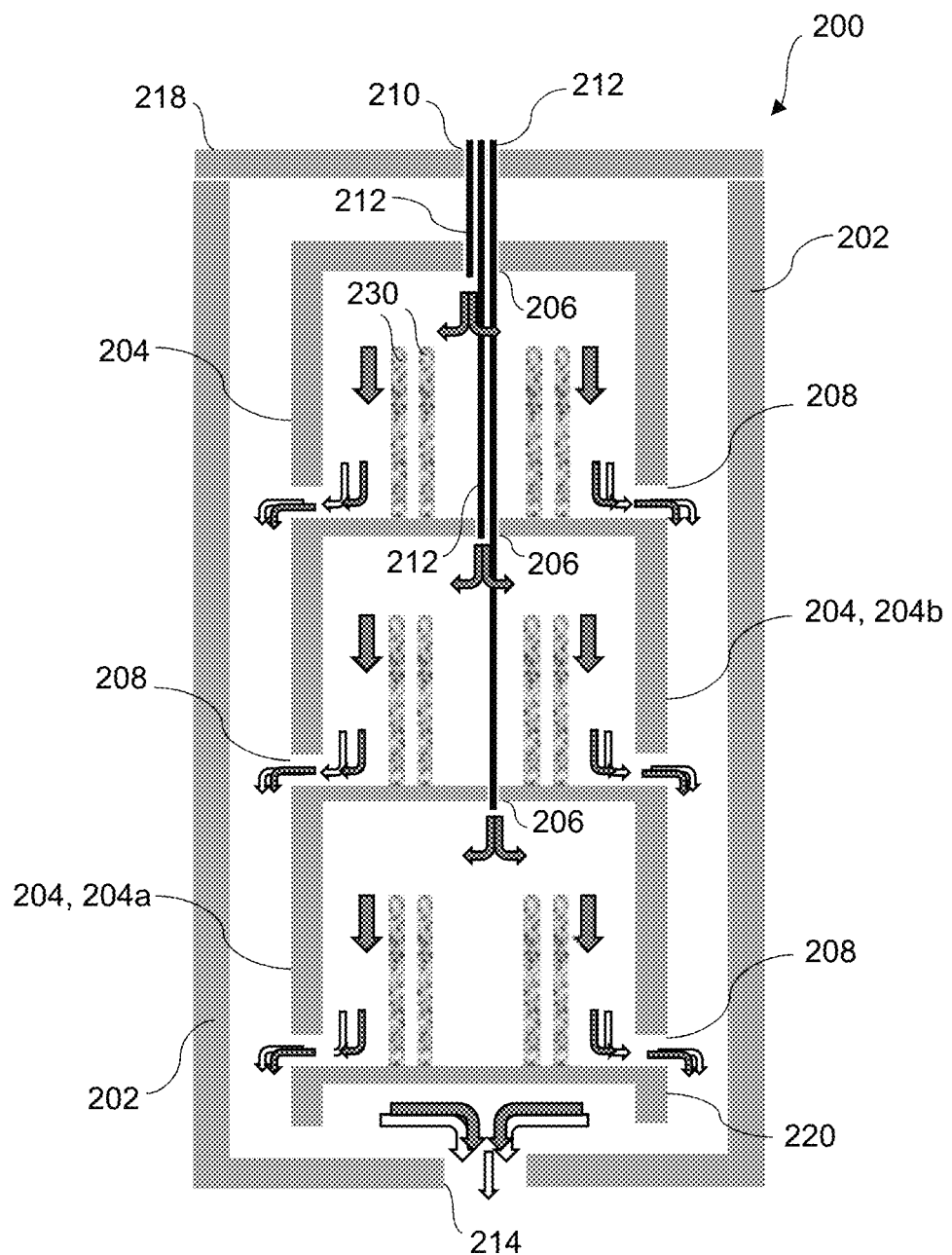
FIG. 2 shows a cross-sectional schematic of one embodiment of an improved apparatus for coating porous or nonporous specimens.

Referring to FIG. 2, the apparatus 200 includes a reaction chamber 202 and a plurality of reaction modules 204 in the reaction chamber 202 for containing specimens (e.g., porous specimens) 230 to be coated. Each reaction module 204 includes a module inlet 206 and a module outlet 208. The apparatus 200 also includes a plurality of conduits 212 configured to be in fluid communication with at least one gas source external to the apparatus 200. Each conduit terminates in one of the reaction modules 204 for delivery of gaseous reagents from the gas source to the specimens 230. Exemplary flow paths of the gaseous reagents are represented by shaded arrows in FIG. 2. Each conduit 212 extends through at least one module inlet 206. A plurality of the conduits 212 may pass through and/or be connected to one or more inlet ports 210 in the reaction chamber 202.

As illustrated in FIG. 2, the apparatus 200 may include a single inlet port 210 through which multiple conduits 212 pass. In an alternative embodiment, the apparatus may include multiple inlet ports, and a single conduit or multiple conduits may pass through each inlet port. Each of the conduits 212 may either pass through an inlet port 210 or have a downstream end secured to the inlet port 210. In all of these embodiments, the conduits 212 are configured to be in fluid communication with one or more gas sources during operation of the apparatus 200 in order to supply gaseous reagents into the reaction modules 204. In some embodiments, additional conduits external to the reaction chamber 202 may connect the inlet port(s) to the gas source(s). Accordingly, the conduits 212 may be directly or indirectly connected with the one or more gas sources.

The module outlets 208 are in fluid communication with the reaction chamber 202 and configured to direct gaseous reaction products out of the reaction modules 204, e.g., toward an inner wall of the reaction chamber 202 and/or in a direction transverse to a longitudinal axis of the reaction chamber 202. Each reaction module 204 includes one or more module outlets 208. Exemplary flow paths of the gaseous reaction products are represented by unshaded arrows in FIG. 2. Gaseous reaction products expelled from the module outlets 208 may be removed from the reaction chamber 202 through one or more outlet ports 214, as shown for example in FIG. 2. During operation of the apparatus 200, the outlet port(s) 214 may be in fluid communication with a vacuum pump for providing a reduced pressure in the reaction chamber 202 compared to the reaction modules 204, as discussed below.

The apparatus 200 may further comprise a lid 218 secured to an end of the reaction chamber 202. The one or more inlet ports 210 may be disposed in the lid 218, which may be removed from the reaction chamber 202 as needed. The conduits 212 may also be removed and reinserted as needed. For example, after use of the apparatus 200, the lid 218 and/or conduits 212 may be readily removed to allow access to the reaction chamber 202 for cleaning and/or specimen removal. The reaction modules 204 may also be individually removable from the reaction chamber 202 to facilitate easy specimen insertion and removal. The reaction chamber 202 may be sealed during operation to maintain a controlled environment therein.

Figure 1:
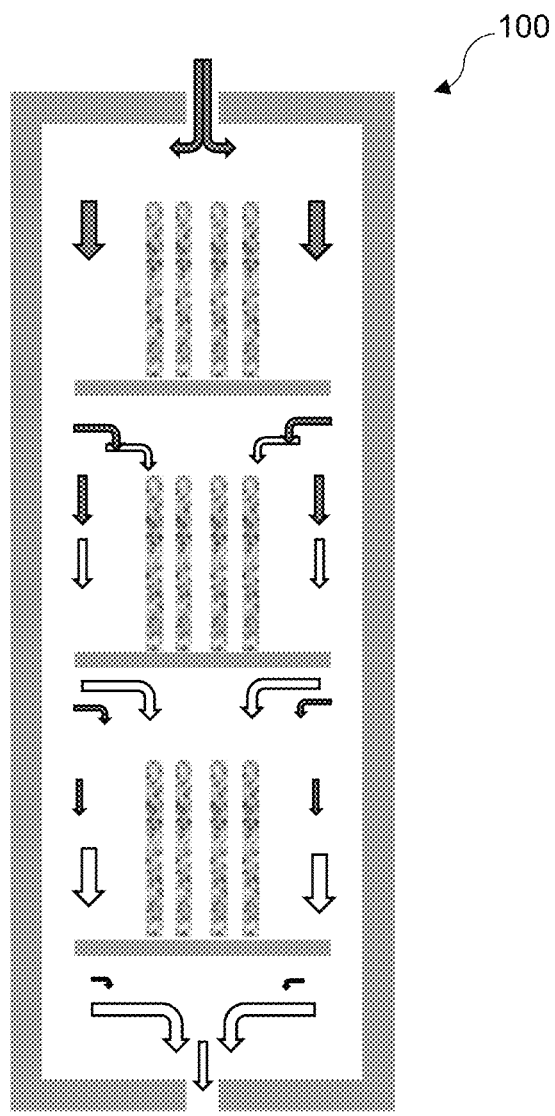
FIG. 1 shows a cross-sectional schematic of a prior art apparatus for chemical vapor infiltration.

As shown in FIG. 2, the reaction modules 204 may be arranged adjacent to each other along a longitudinal axis of the reaction chamber 202. More particularly, the reaction modules 204 may be (vertically) stacked within the reaction chamber 202. For example, a first of the reaction modules 204a may be stacked on a sample support plate 220, and a second of the reaction modules 204b may be stacked on the first of the reaction modules 204a, such that a top surface of the first of the reaction modules 204a functions as a sample support plate for the second of the reaction modules 204b. The number of reaction modules 204 included in the reaction chamber 202 typically ranges from three to six, although the chamber 202 may be designed to include a larger number (e.g., greater than six) reaction modules 204. The reaction modules 204 may be sized and/or configured to accommodate a single level of specimens 230 to avoid highly variable upstream and downstream reaction conditions, as in the prior art apparatus 100 of FIG. 1.

The inlet port 210 and the module inlets 206 may be aligned with the longitudinal axis of the reaction chamber 202, as shown for the exemplary apparatus 200 of FIG. 2. Accordingly, the conduits 212 may be substantially straight. At least one of the conduits 212 may pass through at least one of the reaction modules 204 prior to terminating in another of the reaction modules 204. Also or alternatively, at least one of the conduits 212 may include bends or curves to accommodate a particular module arrangement and/or chamber geometry. The conduits 212 may be stiff or flexible. During operation of the apparatus 200, the conduits 212 may be in fluid communication with a single gas source or with multiple gas sources. The outlet port 214 may be aligned with the longitudinal axis of the reaction chamber in opposition to the inlet port 210, or the outlet port 214 may have some other placement in the chamber 202. As indicated above, there may be multiple outlet ports 214. The reaction chamber 202 typically has a cylindrical shape, although other shapes (e.g., rectangular parallelepiped, sphere, etc.) are possible. Similarly, the reaction modules 204 typically have a cylindrical shape but other shapes as indicated above are also possible.

Typically, the reaction chamber 202, the reaction modules 204 and/or other components of the apparatus 200 are made of a refractory material such as graphite or a carbon composite that can withstand temperatures in excess of 2000° C. and has good thermal properties and chemical resistance.

In addition to the apparatus described above, an improved method of coating specimens using CVI or CVD has been developed. The method is described in reference to FIG. 2, as the apparatus 200 shown in this figure and described in detail above may be employed for the method.

The method includes heating a reaction chamber 202 containing a plurality of specimens (e.g., porous specimens) 230. The reaction chamber 202 comprises a plurality of reaction modules 204, where each reaction module 204 includes a module inlet 206 and a module outlet 208 and contains at least one of the porous specimens 230. In a CVI process, gaseous reagents are flowed through the module inlets 206 and into the reaction modules 204, where they infiltrate the porous specimens 230 and chemically react to form coatings on the porous specimens 230. In a CVD process, gaseous reagents that flow through the module inlets 206 and into the reaction modules 204 chemically react to form coatings on the specimens without necessarily infiltrating the specimens, which may not be porous. In CVI or CVD, the pressure in each of the reaction modules 204 is higher than the pressure in the reaction chamber 202 to ensure that gaseous reaction products are expelled from the reaction modules 204 through the module outlets 208. The gaseous reaction products may then be removed from the reaction chamber 202 through one or more outlet ports 214. As a consequence, the reaction products from each reaction module 204 are substantially prevented from contaminating CVI or CVD reactions occurring in adjacent reaction modules 204.

The gaseous reagents may be flowed into the reaction modules through a plurality of conduits 212 in fluid communication with one or more gas sources outside the chamber 202, where each conduit 212 terminates in one of the reaction modules 204. Each conduit 212 may pass through or be connected to one or more inlet ports 210 in the reaction chamber 202, as described above. Each conduit 212 may pass through at least one of the module inlets 206. As shown in FIG. 2, at least one of the conduits 212 may extend through at least one of the reaction modules 204 prior to terminating in another of the reaction modules 204.

The outlet port(s) 214 of the reaction chamber 202 may be in fluid communication with a vacuum pump. Also or alternatively, the flow rate of the gaseous reagents into the reaction modules 204 may be controlled. Thus, a suitable pressure differential between the reaction chamber 202 and the reaction modules 204 may be achieved along with forced flow of the gaseous reagents through the reaction modules 204. The pressure in each of the reaction modules 204 may be in a range from about one to about five orders of magnitude higher than that in the reaction chamber 202. In other words, the pressure may be from about 10 times to about 100,000 times higher in the reaction modules 204 than in the reaction chamber 202. For example, the pressure in each of the reaction modules 204 may be in a range from about 1 Torr to about 50 Torr, and the pressure in the reaction chamber 202 may be in a range from about 1 mTorr to about 50 mTorr. Typically, the method is carried out with each of the reaction chamber 202 and the reaction modules 204 at a pressure below atmospheric pressure (760 Torr). Thus, prior to introducing the gaseous reagents into the reaction modules 204, the reaction chamber 202 and the reaction modules 204 may be evacuated to a desired vacuum level (i.e., to a desired a sub-atmospheric pressure level) using one or more vacuum pumps.

Typically, the reaction chamber 202 is heated to an elevated temperature in a range from about 700° C. to about 1800° C. The heating may comprise inductive heating, radiative heating, microwave heating, or another heating method capable of increasing the temperature of the reaction chamber 202 to the desired elevated temperature. The reaction chamber 202 is maintained at the elevated temperature during the CVI or CVD process, which may be carried out for a period of 15 minutes to 100 hours.

The gaseous reagents employed in the process may include a reaction precursor and a carrier gas and may depend on the coating to be formed. In one example involving porous specimens, the specimens to be coated may be fiber preforms comprising silicon carbide (SiC) and the coating may be a fiber interphase coating comprising carbon or boron nitride. In another example involving porous specimens, the specimens to be coated may be SiC fiber preforms and the coating may be a matrix (or rigidization) coating comprising SiC. If desired, both a fiber interphase coating and a matrix coating may be applied to the fiber preform in separate but sequential CVI processes, which may be carried out as described above and/or in the apparatus described above. The fiber preforms that undergo coating may be fabricated using fiber arrangement and lay-up processes known in the art.

If a matrix coating comprising SiC is to be formed by CVI on a SiC fiber preform, the gaseous reagents may include methyltrichlorosilane ($CH_3SiCl_3$; reaction precursor) and hydrogen gas ($H_2$; carrier gas). During the chemical reaction, methyltrichlorosilane may decompose to form solid SiC and gaseous hydrochloric acid (HCl), the former of which is deposited on the fiber preform as the coating while the latter is removed from the reaction modules by entrainment in the carrier gas. Other gaseous reagents (including reaction precursors and carrier gases) suitable for forming matrix coatings and fiber interphase coatings are known in the art and may be employed in the above-described method and apparatus.

As would be apparent to the skilled artisan, the method described here may be carried out in the apparatus described above, including any of the components, configurations, and/or capabilities shown in FIG. 2 and/or set forth in the above description.

As would also be recognized by the skilled artisan, the above-described apparatus and method may be used to coat specimens using CVI or CVD. Porous specimens are typically coated by CVI, whereas the specimens coated by CVD need not be porous. The apparatus employed for CVD may be similar or identical to the apparatus employed for CVI. Other aspects of the method and apparatus described for CVI may apply also to CVD.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

Although considerable detail with reference to certain embodiments has been described, other embodiments are possible. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages, and it is not necessarily expected that all of the described advantages will be achieved with every embodiment.

The invention claimed is:

1. A method for coating specimens, the method comprising:

heating a reaction chamber containing a plurality of reaction modules and a plurality of specimens to be coated, each of the reaction modules including a module inlet and a module outlet and containing at least one of the specimens;

flowing gaseous reagents through the module inlets and into the reaction modules, the gaseous reagents chemically reacting to form coatings on the specimens; and maintaining a pressure in each of the reaction modules higher than a pressure in the reaction chamber, gaseous reaction products thereby being expelled from the reaction modules through the module outlets, wherein the gaseous reagents are flowed into the reaction modules through a plurality of conduits in fluid communication with one or more gas sources, each of the conduits including a single inlet and single outlet for flow of the gaseous reagents therethrough, and each of the conduits terminating within a volume defined by a different reaction module.

2. The method of claim 1, wherein the reaction chamber comprises one or more outlet ports, and wherein the gaseous reaction products are removed from the reaction chamber through the one or more outlet ports.

3. The method of claim 2, wherein the one or more outlet ports are in fluid communication with a vacuum pump.

4. The method of claim 1, wherein the conduits pass through and/or are connected to one or more inlet ports in the reaction chamber.

5. The method of claim 1, wherein the pressure in each of the reaction modules is from about one to about five orders of magnitude higher than that in the reaction chamber.

6. The method of claim 1, wherein the pressure in each of the reaction modules is in a range from about 1 Torr to about 50 Torr, and the pressure in the reaction chamber is in a range from about 1 mTorr to about 50 mTorr.

7. The method of claim 1, wherein the reaction chamber is heated to an elevated temperature in a range from about 700° C. to about 1800° C.

8. The method of claim 1, wherein the specimens comprise porous specimens, and wherein the gaseous reagents flowed through the module inlets infiltrate the porous specimens.

9. The method of claim 8, wherein the porous specimens comprise silicon carbide fiber preforms, and wherein the coatings comprise silicon carbide, boron nitride, or carbon.

10. The method of claim 1, wherein the reaction chamber includes a single inlet port through which the plurality of conduits pass.

11. The method of claim 1, wherein the plurality of reaction modules are stacked within the reaction chamber.

12. The method of claim 1, wherein at least one of the conduits passes through at least one of the reaction modules prior to terminating in the volume defined by the different reaction module.

13. The method of claim 1, wherein a first of the reaction modules is stacked on a sample support plate, and wherein a second of the reaction modules is stacked on the first of the reaction modules, such that a top surface of the first of the reaction modules functions as a sample support plate for the second of the reaction modules.

14. The method of claim 1, comprising from three to six reaction modules.

15. The method of claim 1, wherein the reaction chamber and/or each of the reaction modules comprise graphite or a carbon composite.

16. The method of claim 1, further comprising a removable lid secured to an end of the reaction chamber.

\* \* \* \* \*